(12) United States Patent
Weyers et al.

(10) Patent No.: US 10,741,541 B2
(45) Date of Patent: Aug. 11, 2020

(54) METHOD OF MANUFACTURING A SEMICONDUCTOR DEVICE

(71) Applicant: Infineon Technologies Dresden GmbH & Co. KG, Dresden (DE)

(72) Inventors: Joachim Weyers, Hoehenkirchen-Siegertsbrunn (DE); Markus Schmitt, Neubiberg (DE); Armin Tilke, Dresden (DE); Stefan Tegen, Dresden (DE); Thomas Bertrams, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 227 days.

(21) Appl. No.: 15/284,675

(22) Filed: Oct. 4, 2016

(65) Prior Publication Data
US 2018/0096985 A1   Apr. 5, 2018

(51) Int. Cl.
| | |
|---|---|
| *H01L 27/02* | (2006.01) |
| *H01L 21/762* | (2006.01) |
| *H01L 21/02* | (2006.01) |
| *H01L 29/66* | (2006.01) |
| *H01L 29/861* | (2006.01) |
| *H01L 21/76* | (2006.01) |
| *H01L 29/06* | (2006.01) |

(Continued)

(52) U.S. Cl.
CPC .... *H01L 27/0255* (2013.01); *H01L 21/02532* (2013.01); *H01L 21/02595* (2013.01); *H01L 21/02667* (2013.01); *H01L 21/76* (2013.01); *H01L 21/76213* (2013.01); *H01L 29/66712* (2013.01); *H01L 29/861* (2013.01); *H01L 29/0634* (2013.01); *H01L 29/417* (2013.01); *H01L 29/4238* (2013.01); *H01L 29/66333* (2013.01); *H01L 29/7395* (2013.01); *H01L 29/7802* (2013.01)

(58) Field of Classification Search
CPC ........ H01L 21/76213; H01L 21/02667; H01L 27/0255; H01L 21/02532; H01L 21/76; H01L 29/66712; H01L 29/861; H01L 21/02595; H01L 29/4238; H01L 29/7395; H01L 29/417; H01L 29/66333; H01L 29/0634; H01L 29/7802
See application file for complete search history.

(56) References Cited

U.S. PATENT DOCUMENTS 6,407,445 B1 *  6/2002  Vashchenko ............ H01L 23/60
                                                         257/630
6,680,505 B2 *  1/2004  Ohba .................. G11C 11/5671
                                                         257/314

(Continued)

FOREIGN PATENT DOCUMENTS

CN       101982881 B     12/2012
DE    202004021424 U1     2/2008

*Primary Examiner* — Savitri Mulpuri
(74) *Attorney, Agent, or Firm* — Murphy, Bilak & Homiller, PLLC

(57) ABSTRACT

A method of manufacturing a semiconductor device includes forming an amorphous silicon layer over a first isolation layer. The method further includes simultaneously forming a gate oxide layer of a transistor device and transforming the amorphous silicon layer into a polycrystalline silicon layer by a thermal oxidation process. Herein a cover oxide layer is formed on the polycrystalline silicon layer.

22 Claims, 12 Drawing Sheets

(51) Int. Cl.
   *H01L 29/423*  (2006.01)
   *H01L 29/417*  (2006.01)
   *H01L 29/739*  (2006.01)
   *H01L 29/78*   (2006.01)

(56) References Cited

U.S. PATENT DOCUMENTS

| | | |
|---|---|---|
| 7,166,876 B2 * | 1/2007 | Huang ............ H01L 21/823418 |
| | | 257/213 |
| 7,511,357 B2 | 3/2009 | Hshieh |
| 7,825,431 B2 | 11/2010 | Bhalla et al. |
| 8,405,036 B2 * | 3/2013 | Tredwell ........... H01L 27/14658 |
| | | 250/370.08 |
| 2005/0167742 A1 | 8/2005 | Challa et al. |
| 2007/0252168 A1 * | 11/2007 | Shimoida ............ H01L 27/0255 |
| | | 257/147 |
| 2008/0135838 A1 * | 6/2008 | Park ................... H01L 29/4908 |
| | | 257/40 |

* cited by examiner

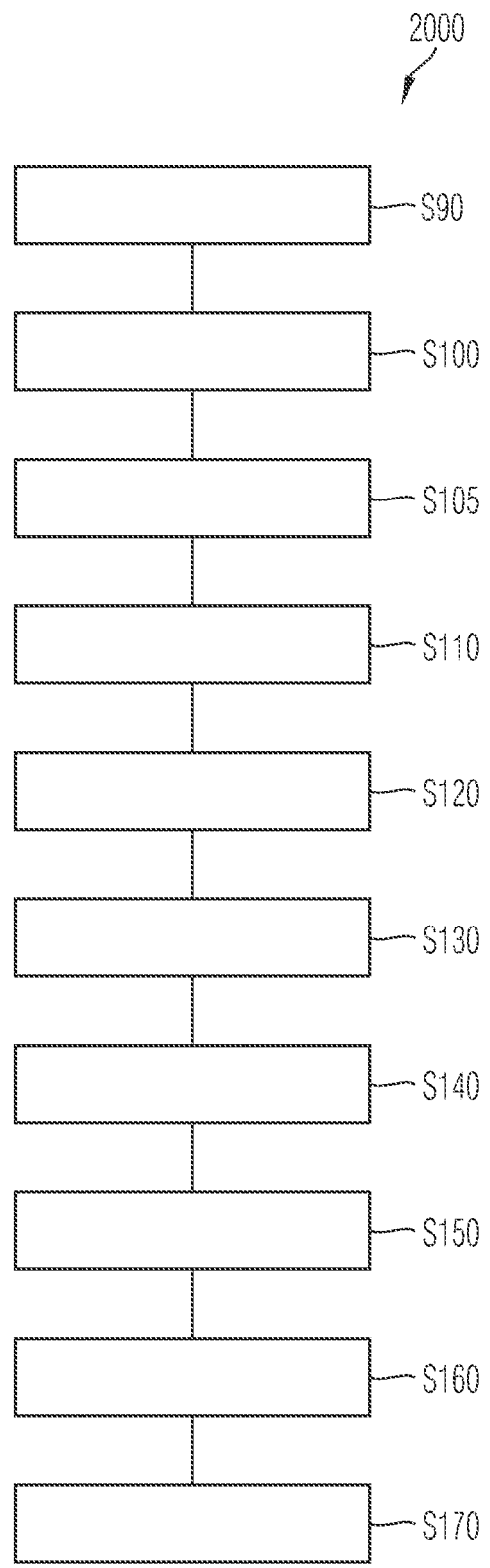

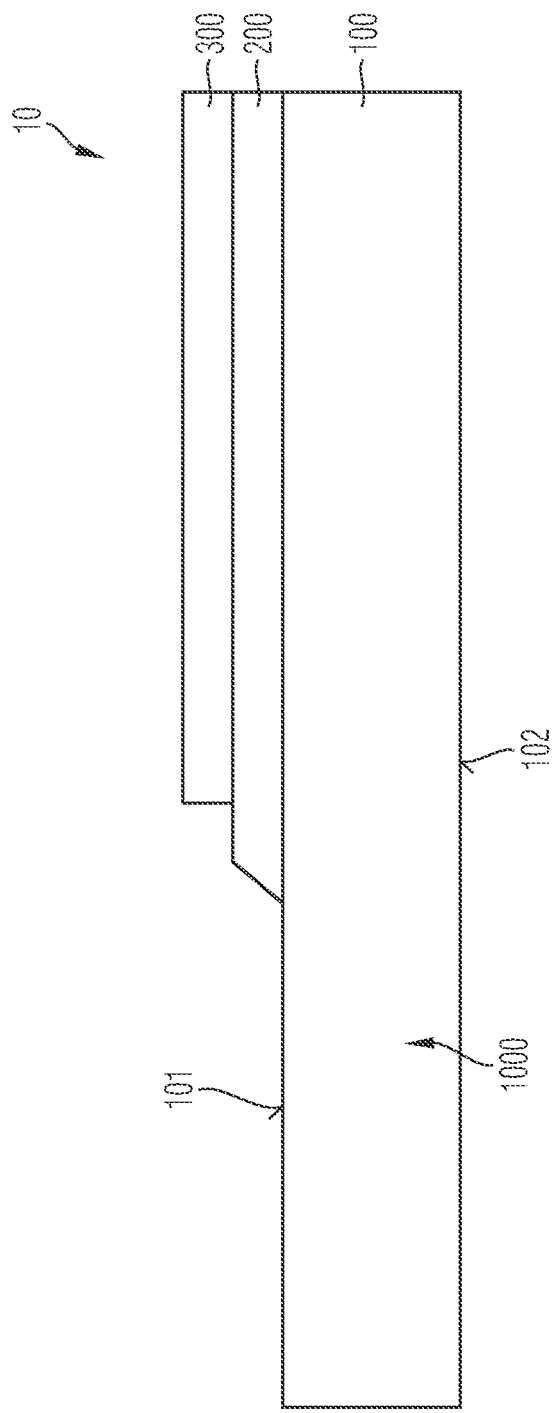

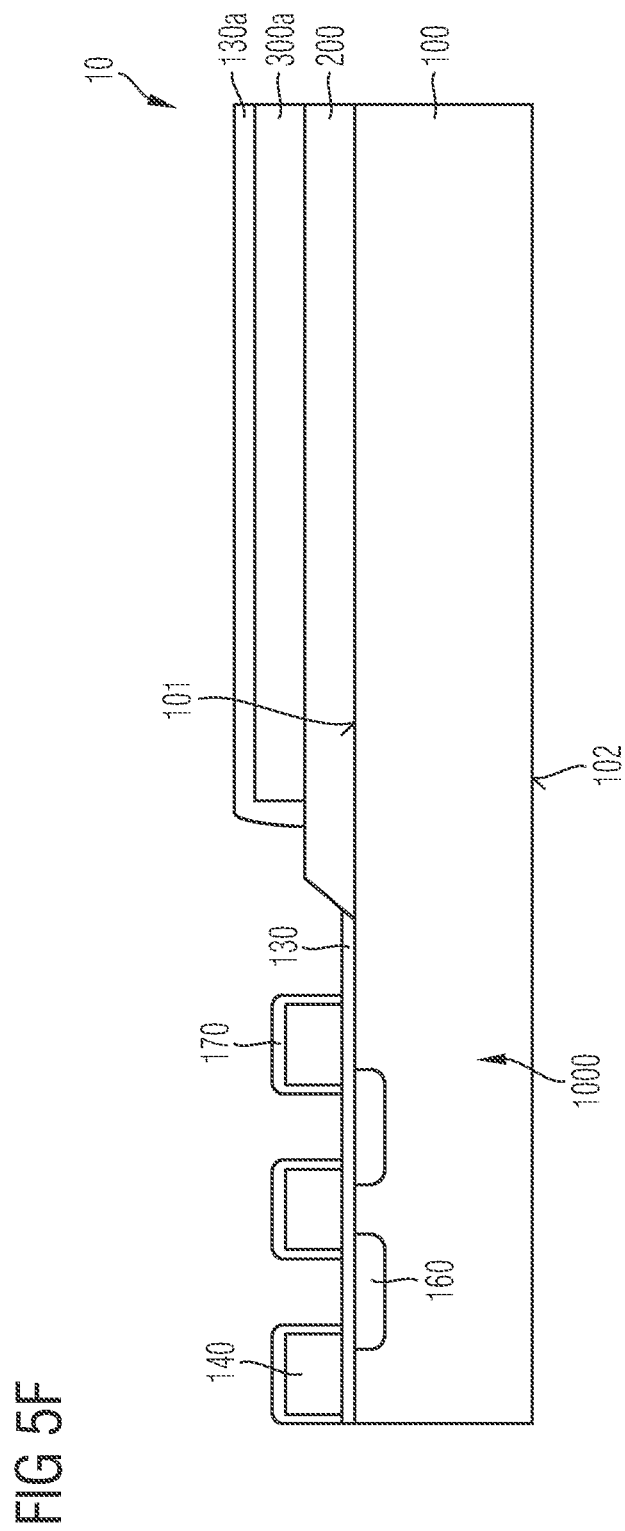

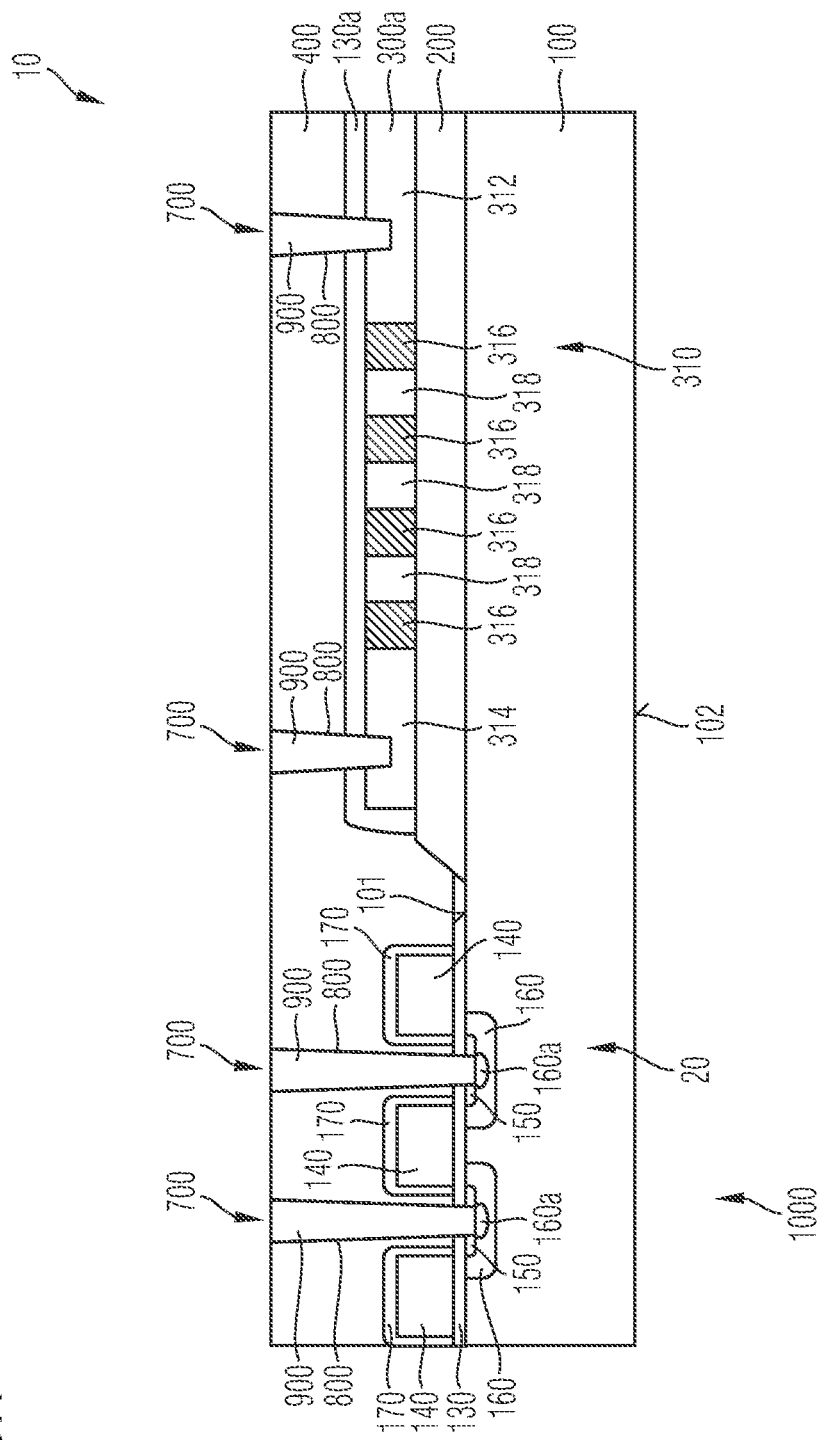

METHOD OF MANUFACTURING A SEMICONDUCTOR DEVICE

BACKGROUND

A key component in semiconductor applications is a solid-state switch. As an example, switches turn loads of automotive applications or industrial applications on and off. Solid-state switches typically include, for example, field effect transistors (FETs) like metal-oxide-semiconductor FETs (MOSFETs) or insulated gate bipolar transistors (IGBTs).

In these applications, a damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided, which protect the transistors from electrostatic discharge during assembly or operation, for example. These ESD protection structures require non-negligible area within the integrated semiconductor device.

It is thus desirable to provide a semiconductor device structure with enhanced ESD protection characteristics, having at the same time an optimized area efficiency.

SUMMARY

According to an embodiment of a method of manufacturing a semiconductor device, the method comprises forming an amorphous silicon layer over a first isolation layer. The method further comprises simultaneously forming a gate oxide layer of a transistor device and transforming the amorphous silicon layer into a polycrystalline silicon layer by a thermal oxidation process. Herein a cover oxide layer is formed on the polycrystalline silicon layer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4 illustrates a schematic process chart of a method of manufacturing a semiconductor device in accordance with an embodiment.

FIGS. 5A to 5H are cross-sectional views illustrating a method of manufacturing a semiconductor device in accordance with an embodiment.

DETAILED DESCRIPTION

Figure 1:
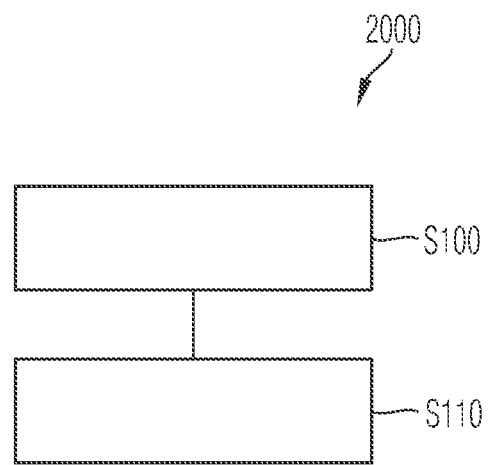
FIG. 1 illustrates a schematic process chart of a method of manufacturing a semiconductor device in accordance with an embodiment.

In the following detailed description, reference is made to the accompanying drawings, which form a part hereof, and in which are shown by way of illustrations specific embodiments in which the invention may be practiced. It is to be understood that other embodiments may be utilized and structural and logical changes may be made without departing from the scope of the present invention. For example, features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n$^+$ regions can have different absolute doping concentrations. The same applies, for example, to an n$^+$ and a p$^+$ region.

The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

It is to be understood that the features of the various embodiments described herein may be combined with each other, unless specifically noted otherwise.

FIG. 1 is a schematic flow diagram for illustrating a method 2000 of manufacturing a semiconductor device.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted therein may be carried out in one or more separate act and/or faces.

A schematic flow diagram for illustrating a method 2000 of manufacturing a semiconductor device is depicted in FIG. 1.

Process feature S100 comprises forming an amorphous silicon layer over a first isolation layer.

Process feature S110 comprises simultaneously forming a gate oxide layer of a transistor device and transforming the amorphous silicon layer into a polycrystalline silicon layer by a thermal oxidation process, wherein a cover oxide layer is formed on the polycrystalline silicon layer.

Due to simultaneously forming a gate oxide layer of a transistor device and transforming the amorphous silicon layer into a polycrystalline silicon layer by a thermal oxidation process, the polycrystalline silicon layer may have an enlarged grain-size of polycrystalline silicon. Thus, a polycrystalline silicon layer may be obtained having a lower boundary trapping density of dopants and lower resistivity of the grains. As a consequence, an electrostatic discharge protection structure formed within the polycrystalline silicon layer can meet both electrostatic discharge (ESD) human body model (HBM) protection ≥1 kV for small chip areas and 2 kV for medium chip areas, wherein the electrostatic discharge protection structure may have low differential resistance in the breakdown mode. In addition, by forming the gate oxide layer of a transistor device and transforming the amorphous silicon layer into the polycrystalline silicon layer by one thermal oxidation process, an additional re-crystallization step of the amorphous silicon layer is not necessary.

Figure 2A:
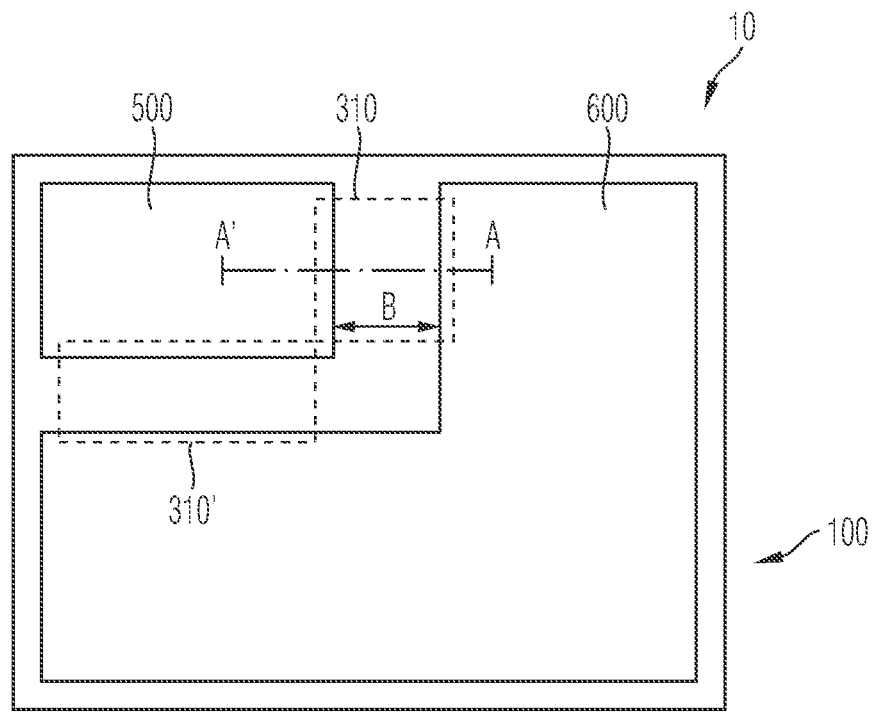
FIGS. 2A and 2B are schematic plan views of a portion of a semiconductor device in accordance with different embodiments.
Figure 2B:
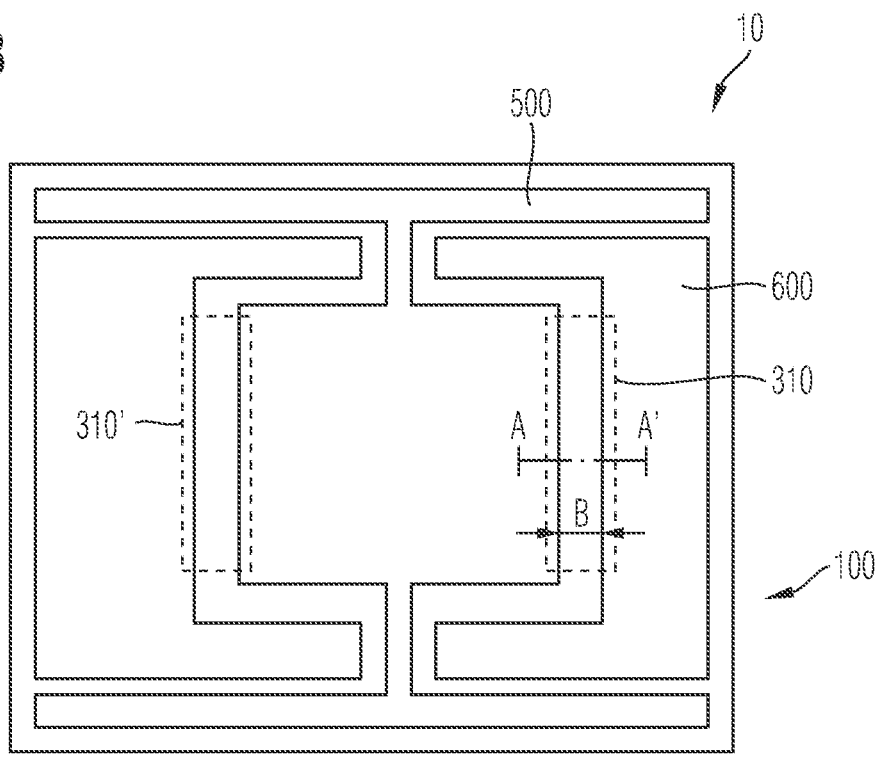

FIGS. 2A and 2B are schematic plan views of portions of a semiconductor device 10 in accordance with different embodiments.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs, and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a control terminal.

When reducing the chip size of the semiconductor device 10, a smaller input capacitance results in an enhanced risk of damage caused by an electrostatic discharge event between the gate and the source of the semiconductor device 10. Thus, the electrostatic discharge protection structure 310 may be applied in a power semiconductor element to protect a gate dielectric between a gate and source of a transistor from damage by dissipating energy caused by an electrostatic discharge event between a gate contact area and a source contact area.

As shown in FIG. 2A, a first electrode 500 is provided in a corner portion of the semiconductor device 10 and may act as a gate contact structure 510 (cf. FIG. 3), which may include a gate pad. The gate pad may be used for providing a bonding or soldering contact to the first electrode 500 to be connected to an external device or element. A second electrode 600 is arranged next to the first electrode 500 and may act as a source contact structure 610 (cf. FIG. 3), which may include a source pad, by which source zones 150 of transistor cells 20 (cf. FIG. 3) in the semiconductor body 100 are contacted.

When forming the semiconductor device 10 as a power semiconductor element, a resulting thickness of the metallization of the first electrode 500 and the second electrode 600 may be in a range of 1 µm to 10 µm or 3 µm to 7 µm, and the first electrode 500 and the second electrode 600 may be separated by a minimum distance B in a range of 5 µm to 20 µm or 10 µm to 15 µm. As shown in FIG. 2B, the first electrode 500 may also be arranged in a middle part of the semiconductor device 10, wherein the second electrode 600 surrounds the first electrode 500. Possible locations of the electrostatic discharge protection structure 310 are indicated by dashed lines, wherein the indicated places are only exemplary and should not be understood as limiting.

Figure 3:
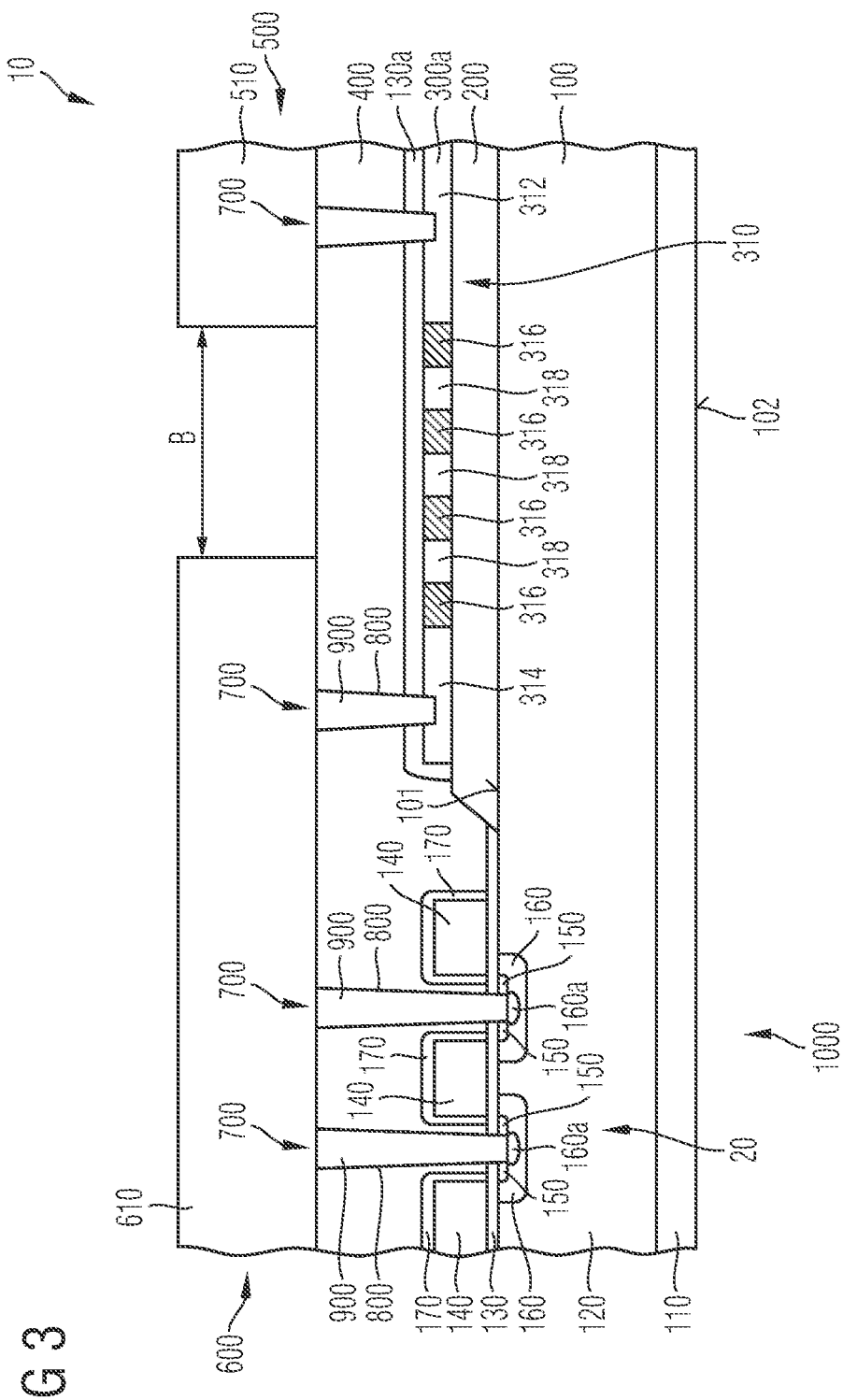
FIG. 3 is a schematic cross-sectional view of a portion of a semiconductor device taken along a section plane A-A' of FIG. 2A or FIG. 2B in accordance with an embodiment.

FIG. 3 is a schematic cross-sectional view of a portion of the semiconductor device 10 taken along a section plane A-A' of FIG. 2A or FIG. 2B in accordance with an embodiment.

The semiconductor body 100 may be provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 5 µm, for example at least 50 µm. Other embodiments may provide semiconductor bodies 100 with a thickness of several 100 µm. The semiconductor body 100 may have a rectangular shape with an edge length in the range of several millimeters.

The normal to the first and second surfaces 101, 102 defines a vertical direction z and directions orthogonal to the normal direction are lateral directions. As can be seen, for example, from FIG. 2A and FIG. 2B, the lateral direction x is defined to be extended between the first terminal region 312 and the second terminal region 314. Thus, the lateral direction x is effectively parallel to the direction of a breakdown current within the electrostatic discharge protection structure 310. For the sake of an unambiguous understanding of the invention, the lateral direction x may be defined to be extended along the section plane A-A' of FIG. 2A or FIG. 2B. However, it can easily be understood by a person skilled in the art that within an electrostatic discharge protection structure 310' as shown in FIG. 2A, the lateral direction x has to be defined as a direction being orthogonal to the above-defined lateral direction x. Furthermore, as can be seen from FIG. 3, the lateral direction x may be extended even in opposite directions.

The first isolation layer 200 may be formed on the first surface 101 of the semiconductor body 100. The first isolation layer 200 may include any dielectric or a combination of dielectrics adapted to isolate the semiconductor body 100 from the electrostatic discharge protection structure 310 on the first isolation layer 200. The first isolation layer 200 may include one or any combination of an oxide, nitride, oxynitride, a high-k material, an imide, an insulating resin or glass, for example. The first isolation layer 200 may include a field dielectric such as a field oxide and/or a gate dielectric such as a gate oxide. The first isolation layer 200 may include a field oxide formed e.g. by a local oxidation of silicon (LOCOS) process, deposited oxide or STI (shallow trench isolation). The thickness of the field dielectric of the first isolation layer 200 may be in a range of 100 nm to 5000 nm, or 500 nm to 3000 nm, or 800 nm to 1500 nm, the thickness of the gate dielectric of the first isolation layer 200 may be in a range of 5 nm to 200 nm or 40 nm to 120 nm.

A second isolation layer 400 may be formed over an electrostatic discharge protection structure 310 and the first isolation layer 200. The second isolation layer 400 may comprise silicon nitride. The second isolation layer 400 may comprise a stack of first and a second dielectric layers. According to an embodiment, the first dielectric layer may include a tetraethyl orthosilicate (TEOS)/undoped silicate glass (USG) film. The thickness of the first dielectric layer of the second isolation layer 400 may be in a range of 50 nm to 500 nm. The second dielectric layer may include a phosphosilicate glass (PSG) or a borophosphosilicate glass (BPSG). The thickness of the second dielectric layer of the second isolation layer 400 may be in a range of 200 nm to 2 µm.

The first electrode 500 is formed on the second isolation layer 400. Next to the first electrode 500, the second electrode 600 is formed on the second isolation layer 400, which may be spaced apart from the first electrode 500 by the distance B (cf. also FIG. 2A and FIG. 2B). On the first electrode 500 and the second electrode 600, a passivation layer may be formed, which may include one or any combination of an imide, a nitride, an oxide or an oxynitride, for example.

The first electrode 500 and the second electrode 600 may be separate parts of a wiring layer within a same wiring level, e.g. due to lithographic patterning of a common metal wiring layer, wherein the semiconductor device 10 comprises only a single metal wiring layer. The first electrode 500 and the second electrode 600 may be formed as a metal layer structure, which may consist of or contain, as main constituent(s), aluminum Al, copper Cu or alloys of aluminum or copper, for example AlSi, AlCu, or AlSiCu. According to other embodiments, the first electrode 500 and the second electrode 600 may contain one, two, three or more sub-layers, each sub-layer containing, as main constituent, at least one of nickel Ni, titanium Ti, silver Ag, gold Au, tungsten W, platinum Pt, tantalum Ta and palladium Pd. For example, a sub-layer may contain a metal nitride or a metal alloy containing Ni, Ti, Ag, Au, W, Pt, Co and/or Pd.

The electrostatic discharge protection structure 310 may include a series connection of at least one polycrystalline silicon diode. As shown in FIG. 3, the electrostatic discharge protection structure 310 comprises a polycrystalline silicon layer 300a on the first isolation layer 200 having first regions 316 and second regions 318 of opposite conductivity type alternatingly arranged along the lateral direction x. According to the embodiment as shown in FIG. 3, a first terminal region 312 and a second terminal region 314 are located in a region within the polycrystalline silicon layer 300a, which have the same conductivity type as the second regions 318. The detailed manufacturing process of the electrostatic discharge protection structure 310 will be described below.

As a result, a polycrystalline silicon diode chain or string arranged in a lateral direction x having alternating pn-junctions (diodes) at the region boundaries of the first and second regions 316, 318 in the polycrystalline silicon layer 300a is formed. In an embodiment, the doping concentrations of the regions are adapted such that a series connection of ESD protection diodes are formed within the polycrystalline silicon layer 300a. By the number of consecutive diodes each including a first region 316 and a second region 318, the breakdown voltage of the electrostatic discharge protection structure 310 can be adjusted.

The length of the electrostatic discharge protection structure 310 between the first terminal region 312 and the second terminal region 314, respectively, may be in a range of 5 μm to 150 μm or 15 μm to 50 μm. An area of the electrostatic discharge protection structure 310 according to FIGS. 2A and 2B or FIG. 3 may be in a range of 100 μm×50 μm×2=10000 μm², by providing a small gate pad length of 100 μm, an electrostatic discharge protection structure 310 on two orthogonal sides (FIG. 2A) or symmetrical on two opposite sides (FIG. 2B) of the gate pad. The area of the electrostatic discharge protection structure 310 may be up to 500 μm×50 μm×2=50000 μm² or up to 2000 μm×50 μm×2=200.000 μm², by providing a large gate pad length of 1000 μm. The area of the electrostatic discharge protection structure 310 does not increase the total chip area, because the diode is constructed between and partially beneath the metal.

The electrostatic discharge protection structure 310 having a diode width in a range between 1000 μm to 2000 μm may be integrated along the gate contact structure 510 or furthermore within an edge termination structure of the semiconductor device 10, wherein the semiconductor device 10 may be a superjunction metal oxide semiconductor field effect transistor device or an insulated gate bipolar transistor (IGBT) device. Such an embodiment may be advantageous in case of providing a semiconductor device 10 having a small die area (smaller than 1 mm²), wherein a robustness of the electrostatic discharge protection structure 310 with respect to HBM (Human Body Model) tests may be in a range of 1 kV to 4 kV. Assuming a breakdown current of 1 mA per μm diode width, a robustness of the electrostatic discharge protection structure 310 with respect to HBM (Human Body Model) tests may be in a range of 300 V to 4 kV.

The area of the electrostatic discharge protection structure 310 may be appropriately chosen for dissipating energy caused by an electrostatic discharge event (ESD event) between the first electrode 500 and the second electrode 600.

The first electrode 500 may be electrically coupled to the first terminal region 312 of the electrostatic discharge protection structure 310 and the second electrode 600 may be electrically coupled to the second terminal region 314 of the electrostatic discharge protection structure 310 via electrical contact elements of the electrical contact structure 700, respectively.

As can be further seen from FIG. 3, the semiconductor device 10 further comprises a transistor device 1000 comprising transistor cells 20 arranged in an overlap area between the source contact structure 610 and the semiconductor body 100. As already discussed above, the first electrode 500 may comprise a gate contact structure 510 or a gate pad and the second electrode 600 may comprise a source contact structure 610 or source pad of the transistor cells 20 of the transistor device 1000. Each of the transistor cells 20 comprise a gate electrode 140 formed on the gate oxide layer 130, source zones 150 being in contact with the first surface 101 of the semiconductor body 100 and extending into the semiconductor body 100, and body zones 160, in which the source zones 150 are embedded. The source zones 150 are of the first conductivity type and the body zones 160 are of the second conductivity type. Furthermore, a drain region 110 of the first conductivity type is provided at the second surface 102 of the semiconductor body 100.

The drift region 120 is formed between the drain region 110 and the body zones 160 and is of a first conductivity type. In case of a superjunction device, columns or bubbles of the first conductivity type and the second conductivity type can be implemented within the semiconductor body 100. Furthermore, body contact zones 160a are provided to provide an electrical contact between the electrical contact structure 700 connected to the source contact structure 610 and the respective body zones 160. The body contact zones 160a are formed by an ion implantation process of dopants of a second conductivity type, for example, as will be discussed in all detail below.

The electrical contact structure 700 is provided to electrically connect the source contact structure 610 with the second terminal region 314 of the electrostatic discharge protection structure 310. The electrical contact structure 700 may be further provided to connect the source contact structure 610 with the source zones 150 of the transistor cells 20. Thus, the first electrode 500 may comprise a gate contact structure 510 and the second electrode 600 may comprise a source contact structure 610 of transistor cells 20.

Although no multilayer metallization structure is shown, the electrostatic discharge protection structure 310 as described above may be used in discrete semiconductor devices or integrated circuits with multilayer wiring systems, when using polycrystalline silicon plugs.

FIG. 4 is a schematic flow diagram for illustrating a method 2000 of manufacturing a semiconductor device 10 according to an embodiment.

It will be appreciated that while method 2000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted therein may be carried out in one or more separate act and/or faces.

A schematic flow diagram for illustrating a method 2000 of manufacturing a semiconductor device is depicted in FIG. 4.

Process feature S90 comprises forming a first isolation layer on a semiconductor body having a first surface and a second surface being opposite to the first surface.

Process feature S100 comprises forming an amorphous silicon layer over the first isolation layer.

Process feature S105 comprises removing a part of the first isolation layer to expose a part of the surface of the semiconductor body before forming the gate oxide layer on the first surface.

Process feature S110 comprises simultaneously forming a gate oxide layer of a transistor device and transforming the amorphous silicon layer into a polycrystalline silicon layer by a thermal oxidation process, wherein a cover oxide layer is formed on the polycrystalline silicon layer.

Process feature S120 comprises forming a gate electrode of the transistor device on the gate oxide layer.

Process feature S130 comprises forming body zones of the transistor device at the first surface of the semiconductor body.

Process feature S140 comprises forming source zones of the transistor device at the first surface of the semiconductor body.

Process feature S150 comprises forming a second isolation layer over the transistor device and the electrostatic discharge protection structure.

Process feature S160 comprises forming a first electrode over the second isolation layer, the first electrode being electrically coupled to a first terminal region of the electrostatic discharge protection structure, and forming a second electrode over the second isolation layer, the second electrode being electrically coupled to a second terminal region of the electrostatic discharge protection structure.

Process feature S170 comprises forming a drain region of the transistor device at the second surface of the semiconductor device.

As can be seen from FIGS. 5A to 5H, a method of manufacturing the semiconductor device 10 according to an embodiment will be described with reference to cross-sectional views for illustration of selected processes.

Figure 5A:
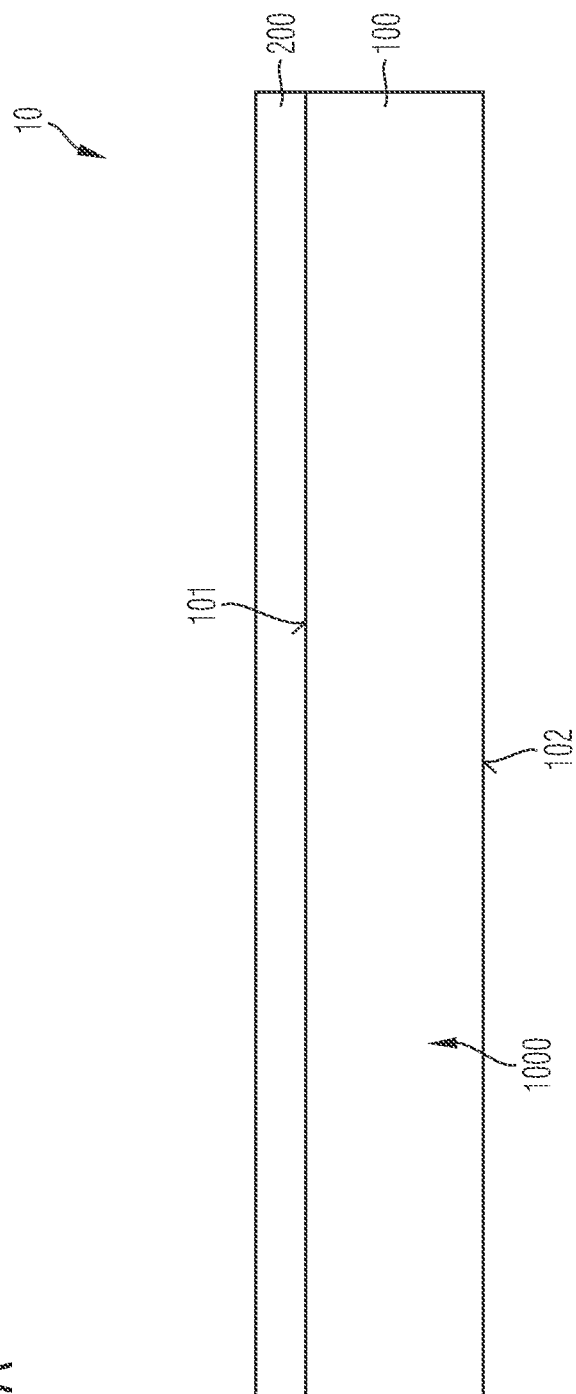

As shown in FIG. 5A, the first isolation layer 200 such as a silicon oxide layer is formed on a semiconductor body 100. The oxide layer of the first isolation layer 200 may be formed by a field oxidation or deposition process. The first isolation layer 200 may be formed by wet oxidation process, for example. The thickness of the first isolation layer 200 in a vertical direction z may be in a range of 100 nm to 5000 nm, or 500 nm to 3000 nm, or 800 nm to 1500 nm. Further characteristics of the first isolation layer 200 can be found above with regard to the description of the semiconductor device 10. Thus, in the process as shown in FIG. 5A, the first isolation layer 200 is formed on the semiconductor body 100 having a first surface 101 and a second surface 102 being opposite to the first surface 101.

Figure 5B:
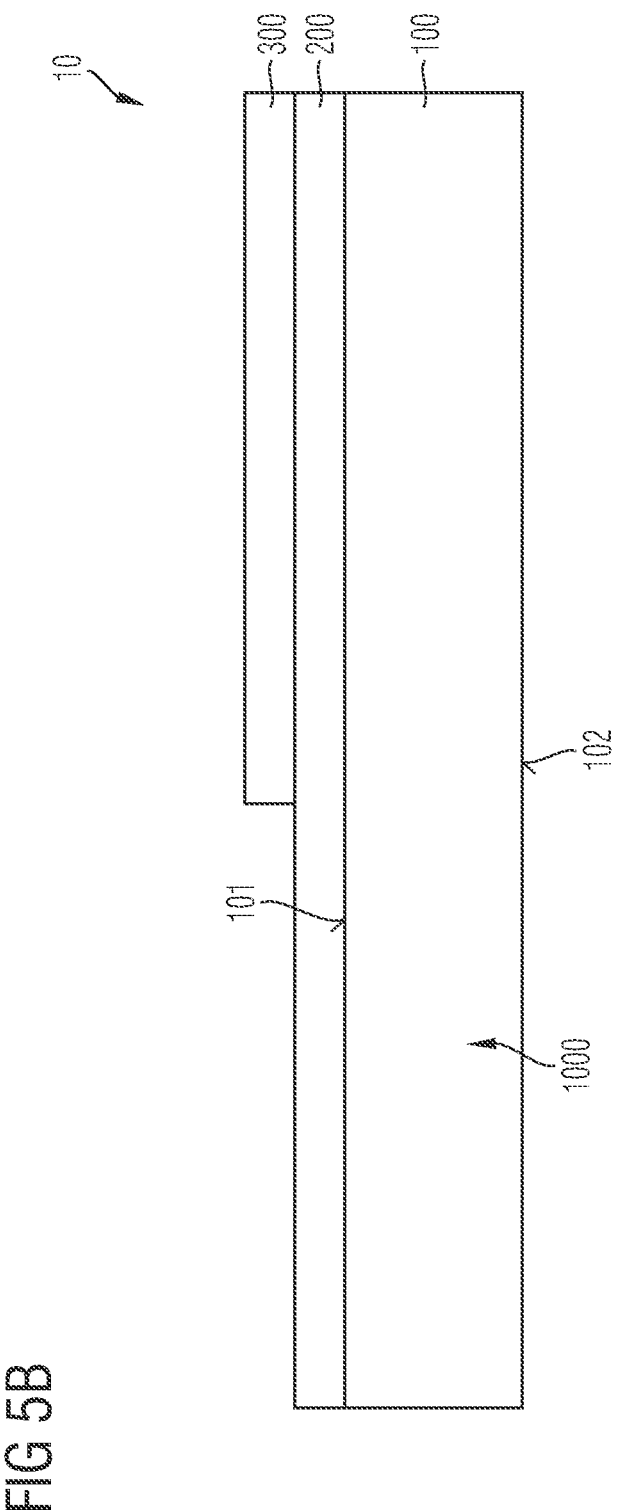

As shown in FIG. 5B, the amorphous silicon layer 300 is formed on the first isolation layer 200. The amorphous silicon layer 300 may be patterned to have a structure within the lateral plane as shown in FIG. 2A or FIG. 2B (cf. the structures in FIGS. 2A and 2B defined by the dashed lines). The thickness of the amorphous silicon layer 300 in a vertical direction z may be in a range of 100 nm to 1000 nm, or 200 nm to 600 nm, or 200 nm to 500 nm.

Ions of a first conductivity type may be implanted into the amorphous silicon layer 300. Herein, a blanket phosphorous implantation may be performed. The implantation dose has to be adjusted, depending on the thickness of the amorphous silicon layer 300, to get a dopant concentration in a range of $1 \times 10^{17}$ cm$^{-3}$ to $1 \times 10^{19}$ cm$^{-3}$. Thus, as will be described later, the ESD protection diode polycrystalline silicon constituting the electrostatic discharge protection structure 310 with a thickness of 100 nm to 1000 nm, or 200 nm to 600 nm is deposited amorphously directly onto the field oxide of the first isolation layer 200, followed by the ion implantation step of ions of a first conductivity type such as phosphorous, for example.

Figure 5C:
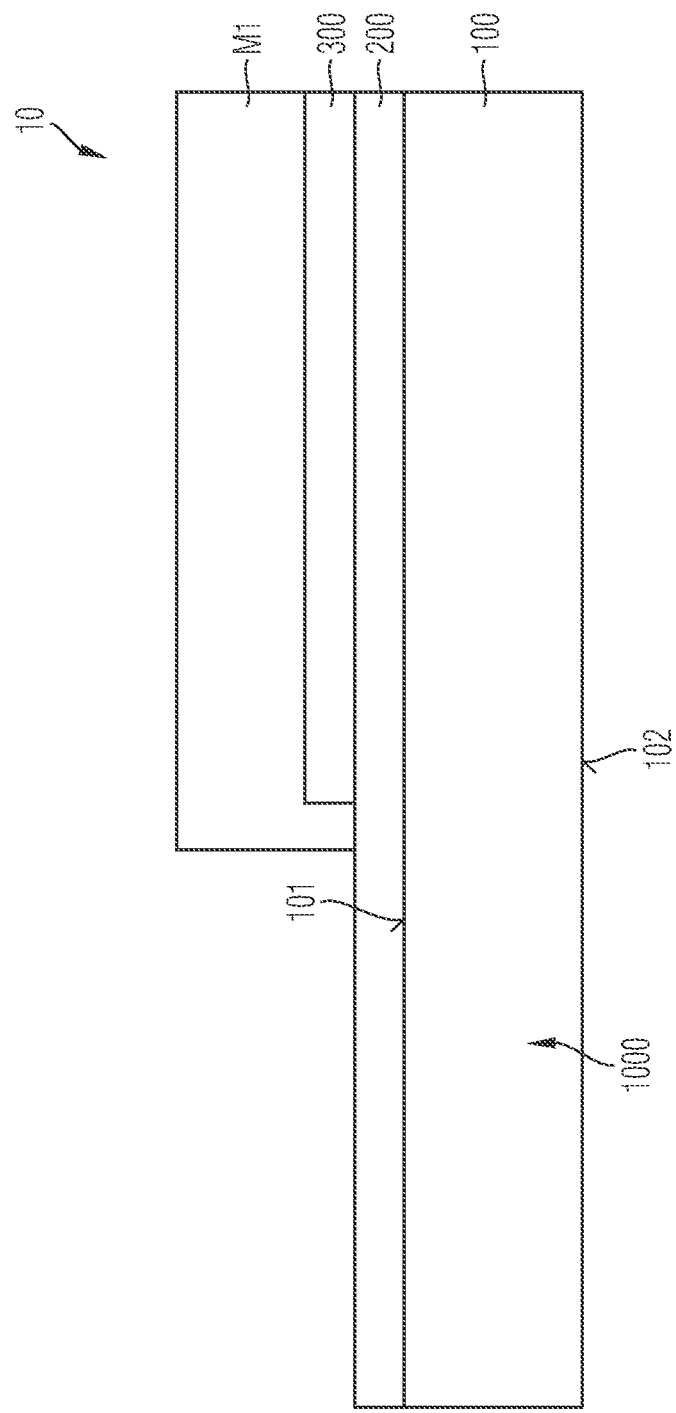

As shown in FIGS. 5C and 5D, after patterning of the amorphous silicon layer 300 and implanting the same with ions of a first conductivity type, a part of the first isolation layer 200 is removed to expose a part of the first surface 101 of the semiconductor body 100. Thus, the first isolation layer 200 is locally etched back by a photolithographic patterning process using a first mask M1. Herein, a mask layer, e.g. a hard mask layer or resist layer may be formed on the amorphous silicon layer 300 and the first isolation layer 200 and may be patterned by a lithographic process, such that the amorphous silicon layer 300 and a part of the first isolation layer 200 in a boundary region within a lateral plane of the amorphous silicon layer 300 are covered by the first mask M1. Herein, a part of the first surface 101 of the semiconductor body 100, in which a gate oxide layer 130 shall be formed, is not covered by the first mask M1. In a subsequent etching process, a part of the first isolation layer 200 is removed to expose a part of the first surface 101 of the semiconductor body 100, on which the gate oxide layer 130 will be formed.

Figure 5E:
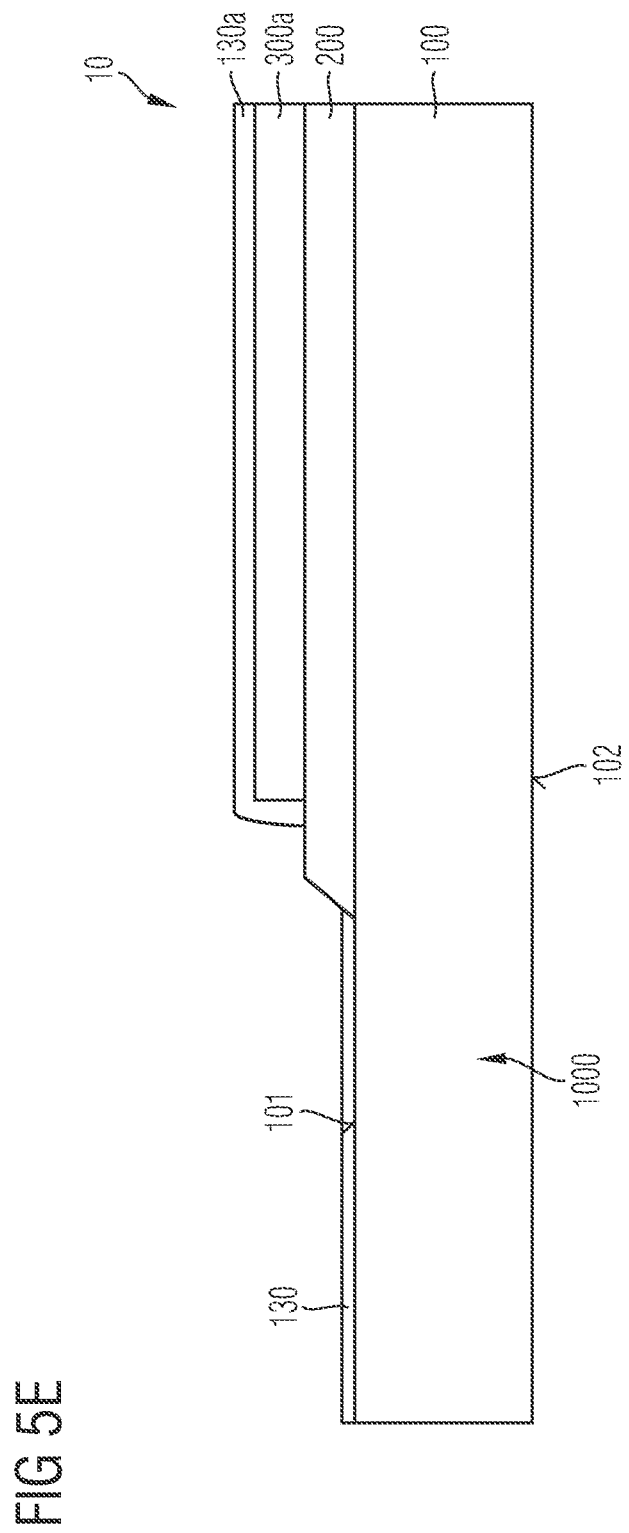

As can be seen from FIG. 5E, simultaneously a gate oxide layer 130 of a transistor device 1000 is formed and the amorphous silicon layer 300 is transformed into a polycrystalline silicon layer 300a by a thermal oxidation process. Herein, a cover oxide layer 130a is formed on the polycrystalline silicon layer 300a. The thermal oxidation process is performed at a temperature range between 500° C. and 1500° C., or between 700° C. and 1200° C., or between 900° C. and 1100° C., for a time range between 60 minutes to 180 minutes, or for a time range between 30 minutes to 150 minutes, or for a time range between 60 minutes and 120 minutes, or for a time range between 80 minutes and 100 minutes. According to an embodiment, the thermal oxidation process comprises performing a temperature ramp having a slope in a range between 0.1 K/min to 50 K/min, or in a range between 0.5 K/min to 20 K/min, or in a range between 1 K/min to 10 K/min, or in a range between 1 K/min to 5 K/min. The peak temperature of the temperature ramp may be in a range between 500° C. to 1500° C., or in a range between 700° C. to 1200° C., or in a range between 800° C. to 1000° C. Performing a temperature ramp includes a steady increase of temperature in time in a thermal treatment machine such as an oven.

In the following, further high temperature processes such as the described gate oxidation, for example, together with their temperature ramps help to increase the grain size of the polycrystalline silicon layer 300a. This is important to provide both reduced leakage currents and high carrier conductivities of the electrostatic discharge protection structure 310 to be integrated in the polycrystalline silicon layer 300a.

The polycrystalline silicon layer 300a may have a minimum grain size of crystalline silicon of 10 nm, or of 20 nm, or of 50 nm, or of 100 nm, or 500 nm. The polycrystalline silicon layer 300a may have a maximum grain size of crystalline silicon of 100 nm, or of 200 nm, or of 500 nm, or of 1000 nm, or of 2000 nm. The polycrystalline silicon layer 300a may have a grain size of crystalline silicon in a range between 10 nm to 1000 nm, or in a range between 20 nm to 1000 nm, or in a range between 50 nm to 1000 nm, or in a range between 100 nm to 1000 nm. The polycrystalline silicon layer 300a may comprise crystalline silicon grains having a grain size larger than 50 nm, or 100 nm, or 500 nm, or 1000 nm, or 1500 nm, or 2000 nm. The polycrystalline silicon layer 300a may comprise crystalline silicon grains having a grain size as large as or larger than the thickness of the polycrystalline silicon layer 300a.

The polycrystalline silicon layer may have a columnar orientation of the crystalline silicon grains. In case of amorphously depositing silicon instead of depositing polycrystalline silicon on the first isolation layer 200, the grain size may be significantly enlarged and furthermore a columnar orientation is obtained. In addition, both leakage current and breakdown spreading of the fully fabricated diodes is reduced significantly. The breakdown voltage of the diode chain is nearly independent from junction temperatures in the range of −55° C. up to +200° C. The leakage current at a gate source voltage VGS=20V is <100 nA (diode width=590 μm), which means the ratio between the gate source current (IGS) and the width is smaller than 0.2 nA/μm at a gate source voltage VGS=20V and Tj=25° C. The ESD window of the diode chain is sufficient small due a small differential resistance factor. From transmission-line pulse (TLP) measurements a value of Rdiff*A in a range between 350 mOhm*mm$^2$ and 550 mOhm*mm$^2$ is obtained for a breakdown voltage of 50V. The statistical spreading of the breakdown voltage is lower than +−1V or +−0.5V or +−0.2V.

During the thermal oxidation process for forming the gate oxide layer 130 of the transistor device 1000, a further thermal oxide layer constituting the cover oxide layer 130a is grown onto and partially into the side walls and the top sides of the polycrystalline silicon layer 300a. The final thickness of the grown thermal cover oxide layer 130a depends on the doping concentration of the polycrystalline silicon layer 300a doped with ions of a first conductivity type such as phosphorous, for example. The thickness of the gate oxide layer 130 may be in a range between 20 nm to 200 nm, or in a range between 50 nm to 150 nm, or in a range between 80 nm to 110 nm.

The polycrystalline silicon layer 300a formed by the oxidation process of the amorphous silicon layer 300 on the first isolation layer 200 has a large grain-size of polycrystalline silicon. Thus, the lateral dimension of the electrostatic discharge protection structure 310 comprising a polycrystalline silicon ESD protection diode chain may be e.g. in a range of 0.5 µm to 5 µm or 1.5 µm to 2.5 µm for each first and second region 316, 318. By extending the electrostatic discharge protection structure 310 over a plurality of grain boundaries of the polycrystalline silicon layer 300a, a stable breakdown characteristic of the electrostatic discharge protection structure 310 is provided. In some embodiments, a plurality of grain boundaries within the polycrystalline silicon layer 300a may lead to an electron mobility in a range of 1 cm$^2$/Vs to 5 cm$^2$/Vs. In case of improving the granular structure of the polycrystalline silicon layer 300a, the electron mobility may be increased to 50 cm$^2$/Vs due to less grain boundaries within the polycrystalline silicon layer 300a. The electron mobility of low temperature polysilicon is in a range of 100 cm$^2$/Vs to 700 cm$^2$/Vs.

Even higher electron mobility values may be achieved by polycrystalline silicon having even greater grain-boundary sizes. An example of such a polycrystalline silicon is a continuous-grain-silicon (CGS), which leads to an electron mobility in a range of 500 cm$^2$/Vs to 700 cm$^2$/Vs. By provision of a continuous grain silicon within the polycrystalline silicon layer 300a, electron mobility values may be achieved, which are comparable to that within the bulk region of the semiconductor body 100.

As shown in FIG. 5F, a gate electrode 140 of the transistor device 1000 is formed on the gate oxide layer 130, and further body zones 160 are formed at the first surface 101 of the semiconductor body 100.

Herein, a deposition of polycrystalline silicon with a thickness in a vertical direction z of 200 nm to 1000 nm, or 400 nm to 800 nm, or 500 nm to 700 nm is performed. The polycrystalline silicon constituting the gate electrode 140 is doped with ions of a first conductivity type such as phosphorous. The net dopant concentration of the polycrystalline silicon constituting the gate electrode 140 may be in a range between $1\times10^{20}$ cm$^{-3}$ to $1\times10^{21}$ cm$^{-3}$.

Next step is the etching of the polycrystalline silicon followed by forming a gate electrode oxidation layer 170 on the gate electrode 140 and an ion implantation of ions of a second conductivity type such as boron, for example. Due to the boron implantation, body zones 160 of the transistor device 1000 are formed at the first surface 101 of the semiconductor body 100. After implantation of the ions of the second conductivity type, a body zone diffusion process is performed at a temperature between 600° C. to 1500° C., or 800° C. to 1200° C., or 1000° C. to 1100° C. for a time range between 50 minutes to 200 minutes, or 80 minutes to 150 minutes, or 100 minutes to 130 minutes. Due to the body diffusion step, a further thermal treatment is performed, which further enlarges the grain size of the amorphous silicon layer 300 being transformed into the polycrystalline silicon layer 300a.

Figure 5G:
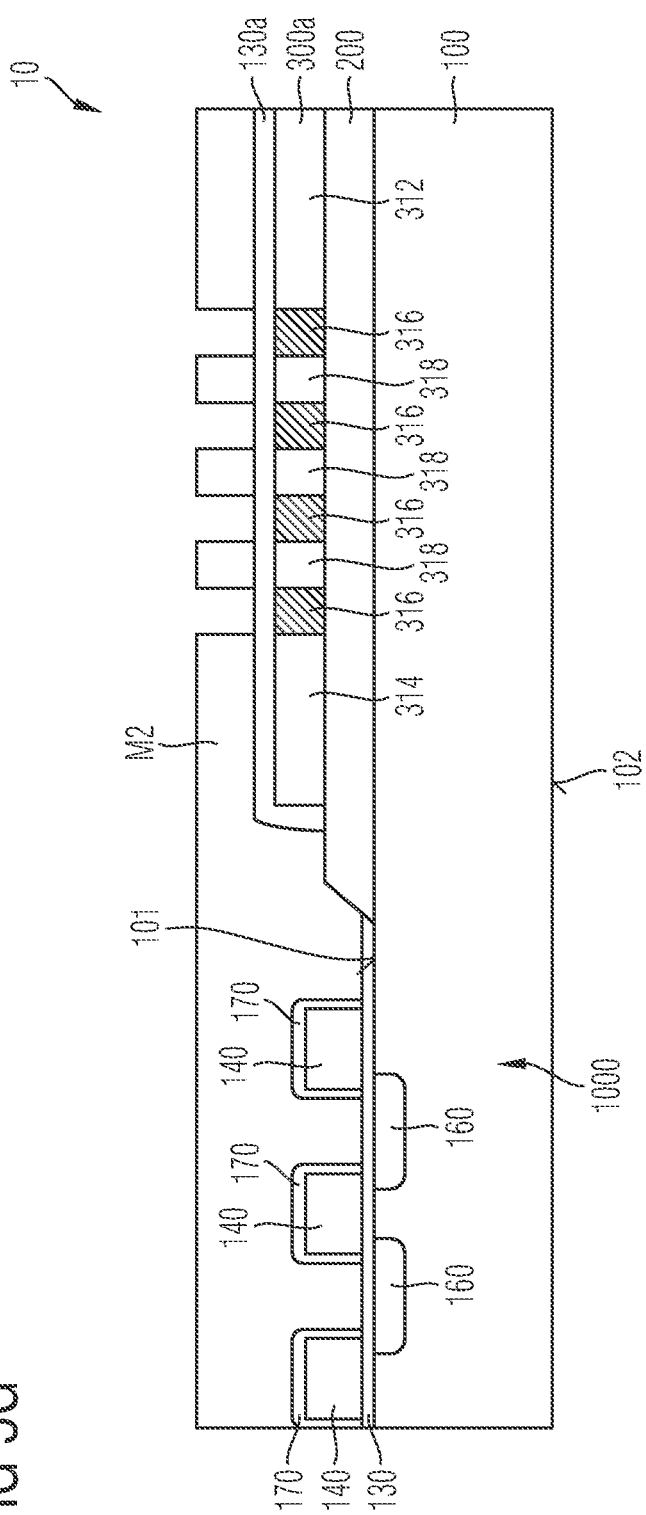

As shown in FIG. 5G, an electrostatic discharge protection structure 310 is formed within the polycrystalline silicon layer 300a. Herein, first regions 316 and second regions 318 of opposite conductivity type alternatingly arranged along a lateral direction x are formed within the polycrystalline silicon layer 300a by a photolithographic patterning process using a second mask M2. Furthermore, a first terminal region 312 and a second terminal region 314 are formed within the polycrystalline silicon layer 300a, wherein the first and second terminal regions 312, 314 are electrically interconnected by the first regions 316 and the second regions 318.

Herein, a mask layer, e.g. a hard mask layer or a resist layer may be formed on the polycrystalline silicon layer 300a and may be patterned by a lithographic process, such that the first regions 316 are not covered by the second mask M2. In a subsequent implantation process, dopants of a second conductivity type are introduced into the exposed first regions 316 not covered by the second mask M2 on the polycrystalline silicon layer 300a, to form the first regions 316 of the second conductivity type. Thus, each of the first regions 316 and second regions 318 comprises first dopants of the first conductivity type, and the first regions 316 further comprise second dopants of the second conductivity type overcompensating the first dopants of the first conductivity type.

According to an embodiment, the polycrystalline silicon layer 300a may have a net dopant concentration of a first conductivity type of about $1\times10^{17}$ cm$^{-3}$ to $1\times10^{19}$ cm$^{-3}$ or $10^{18}$ cm$^{-3}$ to $10^{19}$ cm$^{-3}$. Then, p++-zones of the polycrystalline silicon layer 300a constituting the first regions 316 may be implanted with boron with an implantation dose of $5\times10^{14}$ cm$^{-2}$ up to $6\times10^{15}$ cm$^{-2}$ and implantation energies from 30 keV to 100 keV. The implantation energy has to be large enough to penetrate the thermal cover oxide layer 130a with a thickness of 80 nm to 110 nm on the top side of the polycrystalline silicon layer 300a. The boron implantation is activated by a following thermal process at a temperature between 600° C. to 1200° C. with durations of 30 minutes to 100 minutes.

As can be seen from FIG. 5H, source zones 150 of the transistor device 1000 are formed at the first surface 101 of the semiconductor body 100 by implanting ions of a first conductivity type within the body zones 160 of a second conductivity type.

In addition, a second isolation layer 400 is formed over the transistor device 1000 and the electrostatic discharge protection structure 310 over the first surface of the semiconductor body 100. As discussed above, the second isolation layer 400 may comprise a first dielectric layer and a second dielectric layer, wherein the first dielectric layer may comprise an USG layer having a thickness in a vertical direction z in a range between 50 nm to 500 nm, or 200 nm to 400 nm. The second dielectric layer may comprise a BPSG or PSG-layer having a thickness in a range of 200 nm to 2000 nm, or 1100 nm to 1300 nm. The first and second dielectric layers may further comprise the materials or have structure as discussed above.

Furthermore, trenches 800 penetrating the second isolation layer 400 and the polycrystalline silicon layer 300a are formed. The trenches 800 may extend up to a distance of 300 nm into the polycrystalline silicon layer 300a. The trenches 800 may fully penetrate the polycrystalline silicon layer 300a to reach to the first isolation layer 200. However, the trenches 800 may also not fully extend to the first isolation layer 200.

To form the body contact zones 160a for contacting the body zones 160, a further implantation step of ions of a second conductivity type may be performed, wherein the ions of a second conductivity type are implanted into the semiconductor body 100 by penetrating the trenches 800. Since the ions of second conductivity type such as boron, for example, for generating the body contact zones 160a are also implanted into the first terminal region 312 and the second terminal region 314, a metal silicide layer may be deposited on the polycrystalline silicon layer 300a in the trenches 800, to prevent a Schottky contact, as will be described below. The boron implantation is activated by a 10 s to 60 s rapid thermal process (RTP) of 600° C. to 1200° C. for annealing of the body contact zones 160a and the contact zones within the first and second terminal regions 312, 314 within the polycrystalline silicon layer 300a.

The trenches 800 may be filled with an electrically conductive filling material 900 such as polycrystalline silicon or a metal. The net dopant concentration of the polycrystalline silicon constituting the filling material 900 may be higher than $1 \times 10^{19}$ cm$^{-3}$. Furthermore, to prevent a Schottky contact between a metal filled within the trenches 800 and the polycrystalline silicon layer 300a, a metal silicide layer may be deposited on the polycrystalline silicon layer 300a in the trenches 800. The contact hole processing contains contact hole etching through the interlevel oxide of the second isolation layer 400 into the bulk silicon of the semiconductor body 100 and the ESD protection diode polysilicon of the polycrystalline silicon layer 300a. The contact trench depth of the trenches 800 into the polycrystalline silicon layer 300a is in the range of 100 nm to 300 nm. After a (p++)-p-body-implantation and a silicide step with locally formed TiSi2 and a TiN liner, the contact trenches constituting the electrical contact structure 700 are filled with highly n++-doped polycrystalline silicon plugs constituting the filling material 900. These trench contacts are important to get a small contact resistance of the diodes.

After filling the trenches 800, the filling material 900 such as polycrystalline silicon of the trenches 800 may be removed by a planarization process, e.g. by a chemical mechanical polishing (CMP) process. By this process, a planarized top surface of the second isolation layer 400 may be formed with the electrical contact structure 700.

As can be seen from FIG. 3 illustrating the resulting semiconductor device of the manufacturing processes as shown in FIG. 5A to 5H, a first electrode 500 is formed on the second isolation layer 400, wherein the first electrode 500 is electrically coupled to the first terminal region 312, and further a second electrode 600 is formed over the second isolation layer 400, wherein the second electrode 600 is electrically coupled to the second terminal region 314. Herein, the first electrode 500 may comprise a gate contact structure 510 and the second electrode 600 may comprise a source contact structure 610 of transistor cells 20 of the transistor device 1000. The power metallization constituting the first and second electrodes 500, 600 may have a thickness of 5 μm, for example, and may comprise AlSiCu, for example. In addition, a passivation layer of a thickness of 6 μm, for example, comprising an imide, for example, may be formed.

In addition, a drain region 110 of a first conductivity type of the transistor device 1000 may be formed at the second surface 102 of the semiconductor body 100. Thus, a backside processing to form the drain region 110 completes the power MOS processing with integrated ESD protection diode as Gate/Source ESD-HBM protection.

A method for manufacturing a semiconductor device with additionally integrated ESD protection diode protection diodes has been described. Considering the thermal budget following the first regions 316 constituting the polycrystalline silicon p++-zone of the ESD protection diode, the corresponding process steps are "cold" and/or "short" process steps as compared to the thermal oxidation step for forming the gate oxide layer 130 and the body diffusion step for forming the body zones 160. Therefore, the boron implanted p++-zones constituting the first regions 316 of the electrostatic discharge protection structure 310 have inherently a low doping diffusion length of 200 nm to 600 nm per doping interface to the surrounding polycrystalline silicon layer 300a of a first conductivity type. This leads to small diode lengths and therefore a small differential resistance in the diode breakdown regime during electrostatic discharge (ESD) human body model (HBM) operation. Thus, the manufacturing method is optimized in high temperature processing of the n+-doped ESD protection diode polycrystalline silicon, low temperature processing of the p++-doping zones constituting the first regions 316 of the polycrystalline silicon layer 300a constituting the Zener polycrystalline silicon, drastically increased electrostatic discharge protection (ESD) protection capability without increasing total chip area, screening of the gate oxide constituting the gate oxide layer 130 integrity being still possible, and compatibility of the fabrication process with existing manufacturing processes.

To meet both electrostatic discharge (ESD) human body model (HBM) protection and gate oxide screening at the diode breakdown voltage VBS=k*VDB0 (k=number of electrical blocking pn junctions within the Z diode chain, VDB0=electrical breakdown voltage of each blocking pn junction), the ESD diode should have a low differential resistance in the breakdown mode. This can be obtained by the fabrication of large polycrystalline silicon grains with the consequence of a lower boundary trapping density of dopants and lower resistivity of the grains. To obtain these properties, an ESD protection diode polycrystalline silicon disposition is performed by means of an amorphous silicon layer before high temperature annealing processes. This means, that the phosphorous doped ESD protection diode polycrystalline silicon will be annealed and re-crystallized during the gate oxide processing and later with a smaller influence on the grain size during the body diffusion process.

Herein, the implantation of p++-zones constituting the first regions 316 in the polycrystalline silicon layer 300a constituting the n+-doped ESD protection diode polycrystalline silicon layer is performed to avoid parameter drifts during operation the breakdown regime. To obtain a low differential resistance, the size of the cell pitch of the diode chain constituting the electrostatic discharge protection structure 310 may be as low as possible, for example 2 μm to 6 μm or 3 μm to 5 μm for each pn-subdiode. Therefore, it is proposed to implant the p++-type zones (first regions 316) of the diode constituting the electrostatic discharge protection structure 310 near the end of the front end process. The activation of the p++-type doping is done during the nearly standard CMOS source doping activation process steps. Some additional annealing with a low temperature budget comparable to the source annealing can be done optionally to grant fine tuning capability of the breakdown voltage, if necessary. This ESD diode integrating scenario is also applicable for power technologies with trench gates, IGBTs, SFET or silicon carbide technologies.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   providing a semiconductor body having a first surface;
   forming a first isolation layer that completely covers the first surface,
   forming, while the first isolation layer completely covers the first entire surface of the semiconductor body, an amorphous silicon layer over a first lateral portion of the first isolation layer with a second lateral portion of the first isolation layer being exposed from the amorphous silicon layer;
   simultaneously forming a gate oxide layer of a transistor device and transforming the amorphous silicon layer into a polycrystalline silicon layer by a thermal oxidation process, wherein a cover oxide layer is formed on the polycrystalline silicon layer; and
   forming an electrostatic discharge protection structure within the polycrystalline silicon layer.

2. The method of claim 1, wherein the thermal oxidation process is performed at a temperature range between 500° C. and 1000° C. for a time range between 60 min and 90 min.

3. The method of claim 1, wherein the thermal oxidation process comprises performing a temperature ramp having a slope in a range between 0.1 K/min to 50 K/min.

4. The method of claim 1, wherein the polycrystalline silicon layer comprises crystalline silicon grains having a grain size as large as or larger than the thickness of the polycrystalline silicon layer.

5. The method of claim 1, wherein the polycrystalline silicon layer has a columnar orientation of the crystalline silicon grains.

6. The method of claim 1, wherein the thickness of the amorphous silicon layer is in a range between 100 nm to 1000 nm.

7. The method of claim 1, wherein the thickness of the gate oxide layer is in a range between 20 nm to 200 nm.

8. The method of claim 1, wherein the first isolation layer is formed by a wet oxidation process.

9. The method of claim 1, wherein the thickness of the first isolation layer is in a range between 20 nm to 3000 nm.

10. The method of claim 1, further comprising implanting ions into the amorphous silicon layer before recrystallizing the amorphous silicon layer.

11. The method of claim 1, further comprising:
    forming the first isolation layer on a semiconductor body having a first surface and a second surface being opposite to the first surface.

12. The method of claim 11, further comprising:
    removing a part of the first isolation layer to expose a part of the first surface of the semiconductor body before forming the gate oxide layer on the first surface.

13. The method of claim 11, further comprising:
    forming source zones of the transistor device at the first surface of the semiconductor body.

14. The method of claim 1, further comprising:
    forming a gate electrode of the transistor device on the gate oxide layer.

15. The method of claim 11, further comprising:
    forming a drain region of the transistor device at the second surface of the semiconductor body.

16. The method of claim 1, wherein forming an electrostatic discharge protection structure within the polycrystalline silicon layer comprises:
    forming first regions and second regions of opposite conductivity type alternatingly arranged along a lateral direction within the polycrystalline silicon layer.

17. The method of claim 16, further comprising:
    forming a first terminal region and a second terminal region in the polycrystalline silicon layer, the first and second terminal regions being electrically interconnected by the first regions and the second regions.

18. The method of claim 17, further comprising:
    forming a second isolation layer over the transistor device and the electrostatic discharge protection structure,
    forming a first electrode over the second isolation layer, the first electrode being electrically coupled to the first terminal region, and
    forming a second electrode over the second isolation layer, the second electrode being electrically coupled to the second terminal region.

19. The method of claim 18, wherein the first electrode comprises a gate contact structure and the second electrode comprises a source contact structure of transistor cells of the transistor device.

20. The method of claim 1, further comprising, after forming the amorphous silicon layer and before simultaneously forming the gate oxide layer and transforming the amorphous silicon layer,
    structuring the first isolation layer such that a first lateral portion of the semiconductor body is completely exposed, the first lateral portion of the semiconductor body extending from an outer edge of the semiconductor body to the structured first isolation layer.

21. The method of claim 20, wherein simultaneously forming the gate oxide layer and transforming the amorphous silicon layer comprises completely covering the first surface of the semiconductor body with the gate oxide layer in the first lateral portion of the semiconductor body.

22. A method of manufacturing a semiconductor device, the method comprising:
    providing a semiconductor body having first and second outer edge sides and a first surface extending between the first and second outer edge sides;
    forming a first isolation layer on the first surface such that the first isolation layer extends continuously from the first outer edge side to the second outer edge side;
    forming an amorphous silicon layer exclusively on top of the first isolation layer such that a first lateral portion of the semiconductor body extending from the first outer edge side to an interior location of the semiconductor body is covered both by the first isolation layer and the amorphous silicon layer and such that a second lateral portion of the semiconductor body extending from the second outer edge side to the interior location is covered exclusively by the first isolation layer;

simultaneously forming a gate oxide layer of a transistor device and transforming the amorphous silicon layer into a polycrystalline silicon layer by a thermal oxidation process, wherein a cover oxide layer is formed on the polycrystalline silicon layer; and forming an electrostatic discharge protection structure within the polycrystalline silicon layer.

\* \* \* \* \*